United States Patent [19]

Kleinschmidt

[11] 4,175,242

[45] Nov. 20, 1979

[54] CIRCUIT ARRANGEMENT FOR THE AUTOMATIC FREQUENCY CONTROL OF AN ULTRASONIC TRANSDUCER

[75] Inventor: Peter Kleinschmidt, Munich, Fed. Rep. of Germany

[73] Assignee: Siemens Aktiengesellschaft, Berlin & Munich, Fed. Rep. of Germany

[21] Appl. No.: 897,901

[22] Filed: Apr. 19, 1978

[30] Foreign Application Priority Data

May 11, 1977 [DE] Fed. Rep. of Germany ....... 2721225

[51] Int. Cl.² .......................................... H01L 41/10
[52] U.S. Cl. .................................... 310/316; 318/116
[58] Field of Search ......................... 310/316, 317, 26; 318/116, 118

[56] References Cited

U.S. PATENT DOCUMENTS

| | | |
|---|---|---|
| 3,819,961 | 6/1974 | Bourgeois et al. .................... 310/316 |
| 3,842,340 | 10/1974 | Brandquist ....................... 310/316 X |
| 3,967,143 | 6/1976 | Watanabe et al. .................... 310/316 |

Primary Examiner—Mark O. Budd
Attorney, Agent, or Firm—Hill, Van Santen, Steadman, Chiara & Simpson

[57] ABSTRACT

Circuit arrangement for inducing oscillations in an ultrasonic transducer approximating its natural resonance frequency, and comprising an oscillator for generation of an excitation AC voltage. A pulse gate circuit is connected to supply pulse wise application of the AC voltage to the transducer. The oscillator frequency is controlled by an auxiliary pulse generator connected to the transducer in parallel with the oscillator. A gate circuit and a phase discriminator are employed to produce favorable excitation for the particular oscillation mode of the transducer. The transducer is made preferably from a piezo electric ceramic. The circuit includes means capable of automatically finding the resonance frequency of the transducer.

3 Claims, 6 Drawing Figures

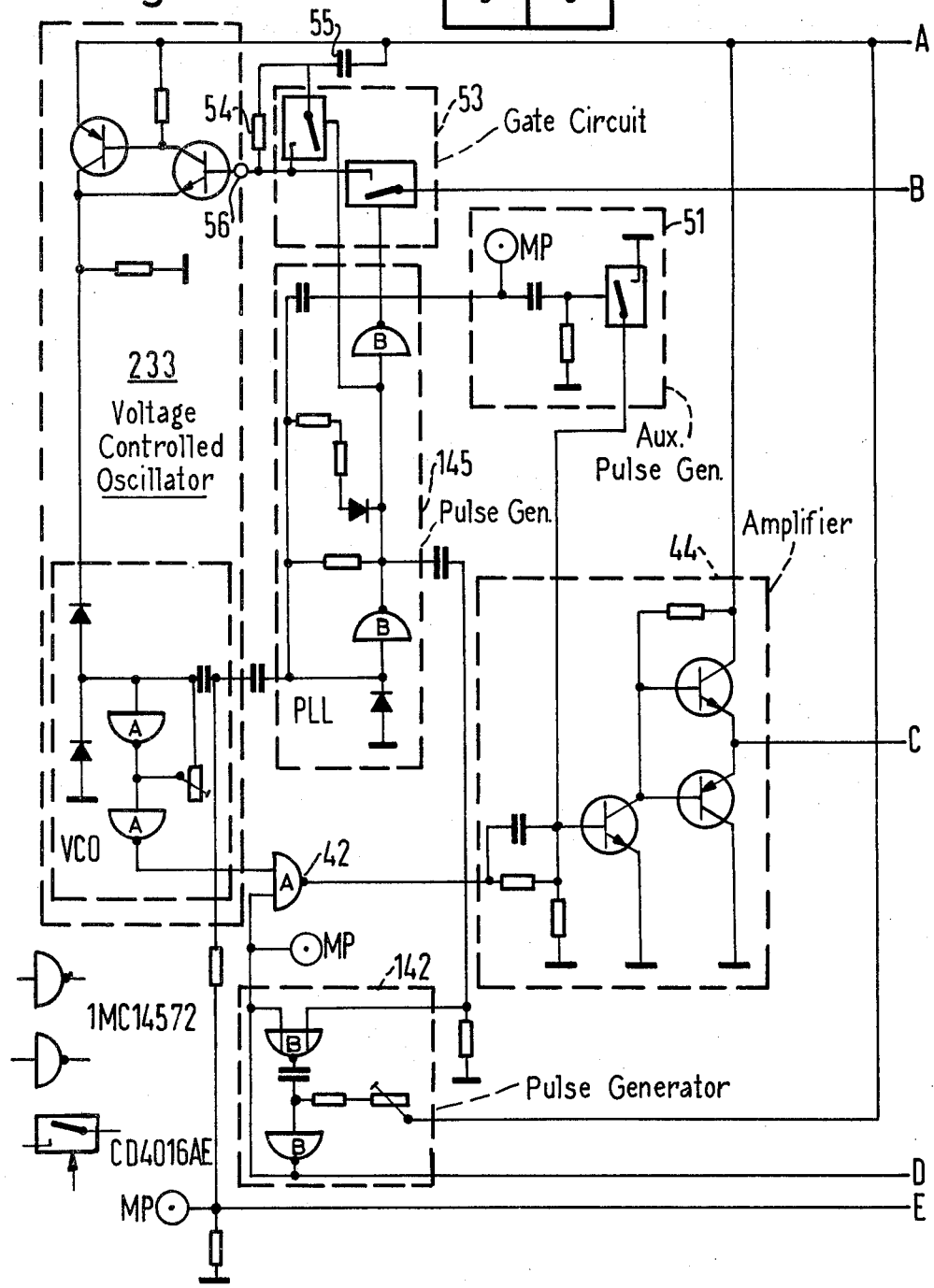

CIRCUIT ARRANGEMENT FOR THE AUTOMATIC FREQUENCY CONTROL OF AN ULTRASONIC TRANSDUCER

BACKGROUND OF THE INVENTION

The present state of the art knows of the use of ultrasonic transducers for the generation of ultrasonic waves. Ultrasonic waves are not only used to perform mechanical work but also for the general purpose of locating objects.

A specific application of locating objects is the use of ultrasonics in burglar alarm systems. Another known application is the remote control of a valve position, specifically in the valve position of a water tap.

Ultrasonic generation is specifically known from ultrasonic transducers made from a piezo electric ceramic, for example, made from lead-zirconium-titanate. Such a polarizable piezo ceramic material has very good power capacity such that considerable ultrasonic output power can be generated using introduced electrical excitation energy at relative good conversion efficiencies. Especially good power generation can be accomplished if the ultrasonic transducer is used in the resonance mode, which means by exciting the transducer in one of its natural oscillation modes. This ultrasonic transducer is nevertheless in such a mode of a relative narrow band, that the deviations between the natural oscillation of the transducer and the frequency of the electrical excitation voltage can lead to a decrease in output power and a reduction of its conversion efficiency. In this context, it has to be taken into account that piezo electric materials are subject to a more or less pronounced, but surely not negligible, aging processes, especially with regard to its polarization, which results in changes of the natural resonance frequency.

In addition to the above mentioned material related causes, there should be taken into consideration the resonance frequency deviation in technical mass production application which are due to the individual distributions of ultrasonic transducers manufactured in mass production even when the utmost of care is taken in their manufacture.

Other causes for resonance frequency changes are contamination and/or the problem created by the transducer getting wet. In addition, the user of ultrasonic transducers has to fight the difficulties which are caused by scatter, tolerances and aging of components of the electronics required for excitation, which is due to the fact that the aging characteristics of the ceramic transducer on the one hand, and the electronic components on the other hand, can be completely different and can lead to different frequency changes.

It is therefore one of the objects of this particular invention to provide a circuit arrangement for the excitation of an ultrasonic transducer which resolves the above mentioned disadvantages, especially to make them less critical with regard to aging of the ceramic, statistical distribution in mass production of the transducers and sensitivity in regard to tolerances of the electronic components of the circuit.

SUMMARY OF THE INVENTION

This objective is accomplished by using a general circuit arrangement in accordance with this invention as hereinafter explained. This particular invention is based on the concept of expanding on, for example, an already known electronic circuit arrangement for the electrical excitation of an ultrasonic transducer in such a fashion, that the expanded circuit arrangement in accordance with this invention is capable in accordance with the ultrasonic transducer to automatically find the resonance frequency for favorable excitation for a particular suitable oscillation mode of the transducer as determined by the user. This oscillation mode can be either one of the primary resonance modes or one of the sympathetic resonance modes as, for example, in a thickness shear mode, a longitudinal mode, a flexural resonator or similar.

BRIEF DESCRIPTION OF THE DRAWINGS

In the following, the basic concept of this invention is illustrated for the sake of simplicity with the help of the drawings, in which.

DESCRIPTION OF THE PREFERRED EMBODIMENTS

Figure 1:
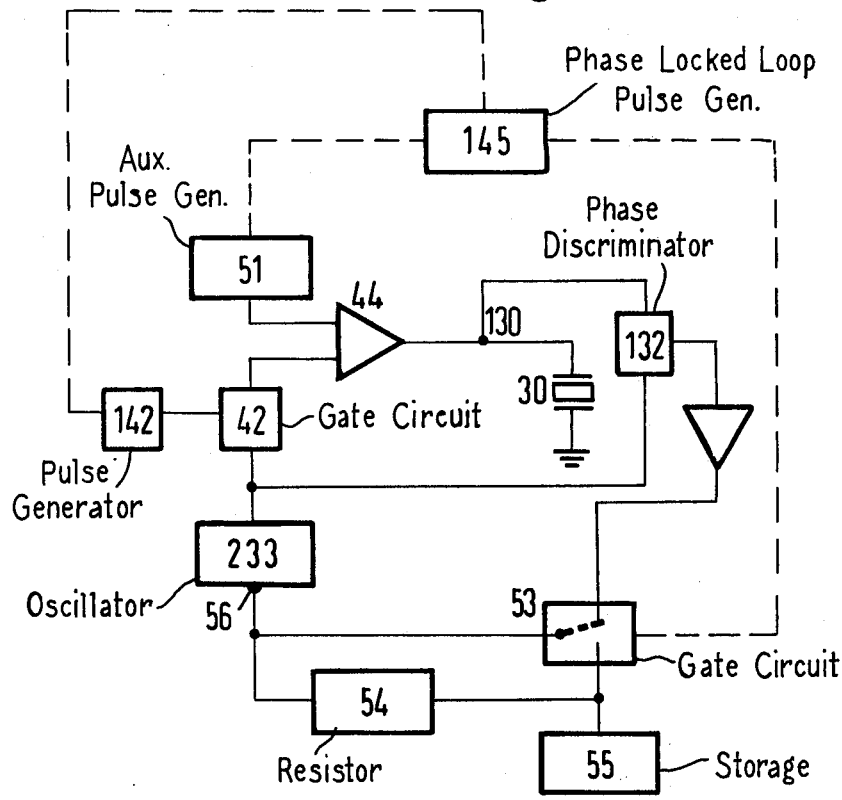
FIG. 1 provides a schematic overview of the total circuit containing the invention.

In FIG. 1, the ultrasonic transducer is indicated as 30. This transducer can double in some cases as the ultrasonic reception transducer, specifically in the intervals between ultrasonic pulse generation.

Figure 1A:
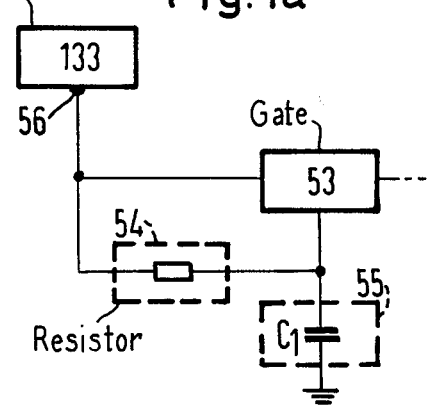
FIG. 1a and FIG. 1b show partial circuit diagrams of portions of the circuit arrangement of the present invention.

The ultrasonic transducer 30 is electrically excited by an alternating voltage generated by an ocillator 133 (see FIG. 1a). In the gate circuit 42, caused by the alternating voltage of oscillator 133, and in accordance with the timing pulse circuit, a pulse generator connected to gate circuit 42, send pulses are generated which, after being amplified in a power amplifier 44, are fed to the transducer 30. Such a circuit arrangement as explained above is disclosed in German application No. P 27 21 254.0, filed on May 11, 1977, and assigned to the same assignee as the present invention.

An auxiliary pulse generator 51 which is clock controlled, and which generates auxiliary pulses, preferentially by the use of amplifier 44, which are fed to the transducer. The reason for this auxiliary pulse generator is to bring transducer 30 into resonance oscillation by introducing to the transducer one or several auxiliary pulses between two work-pulses which get to the transducer 30 by means of the gate circuit 42, and which auxiliary pulses are preceding close in time to the work pulses and which auxiliary pulses are sufficient in value and duration to cause transducer 30 to resonate. Following the excitation of the transducer 30 is the phase of the transducer oscillation die-out, which is the typical resonance frequency for the specific transducer under test, and the specific conditions at a particular moment.

In order for the transducer to operate in its duty cycle in resonance with the predetermined oscillation mode, the frequency of the oscillator alternating voltage is made at least approximately equal to the resonance frequency of this oscillation mode. In order for the auxiliary pulse to excite the predetermined oscillation mode, in accordance with this invention, the carrier frequency of this auxiliary pulse and/or in case of a succession of several auxiliary pulses their respective time interval is chosen such that at least a general agreement exists between the resonance frequency of the transducer 30 and the predetermined oscillation mode. This causes a general agreement between the periodicity of the auxiliary pulses and the periodicity of the alternating voltage of the oscillator 233.

The die-out oscillations of the oscillator in accordance with one of the features of this invention can be sensed at the electrical inputs of the transducer 30 in the form of an electrical alternating voltage signal due to the fact that the transducer 30 is not only an electro to mechanical transducer, but also reciprocally is known as a mechanical to electrical transducer. This electrical signal which is sensed during the duration of the unimpeded die-out of the transducer oscillation is fed to the phase discriminator 132 which also receives the alternating voltage of the oscillator 233. The phase discriminator 132 compares the relative phase position of the two received signals and sends out a compared signal by means of an amplifier to an additional gate circuit 53. This gate circuit 53 has mainly switch functions as is diagrammatically indicated in FIG. 1. The switch position of gate 53, as shown in FIG. 1, indicates a point in time when a signal can reach by way of the phase discriminator 132 and the amplifier and the gate circuit 53 directly to the input 56 of the oscillator 233. With the help of the electrical signal at imput 56, the oscillator 233, which for example, can be a voltage controlled oscillator (VCO) can be controlled with regard to its frequency value of oscillation.

The oscillator 233 can be adjusted therefore, in accordance with this invention in such a way that its oscillation frequency is readjusted during the die-out oscillation of transducer 30 to the frequency value of the natural resonance frequency of the transducer. In order for the frequency adjustment of oscillator 233 to be accomplished in the time intervals in which no natural oscillation of transducer 30 takes place, that is, for example, also during the period of excitation by a working pulse of gate circuit 42, there is a storage member 55 provided which stores the respective output signal of the phase discriminator 132. This signal gets to this storage member 55 by way of the storage input circuit 54. During the remaining time intervals mentioned, the gate circuit 53 is switched over such that the storage member 55 keeps sending a signal corresponding to the output signal of the phase discriminator 132 to the oscillator 233.

The storage stage 55 can be a simple capacitor, due to the fact that the output signal of the phase discriminator 132, is in the usual practical application a DC (direct current) signal.

The time sequence of the individual steps, that is, the input of the auxiliary pulses, followed by the signal sensing at the transducer 30, the feeding of this signal to the phase discriminator 132, the switching of the following gate circuit 53 and the control of the pulse cycle 142, respectively, the gate circuit 42 is controlled by a central phase locked loop pulse generator 145.

A special further development of this invention is seen in the objective of making the frequency control of the oscillator 233, respectively, the voltage of the alternating current for the transducer independent of, for example, statistical variations, which could materialize for individual sensing cycles of the frequency values in the die-out oscillation of the transducer. The invention principle of self adjustment of this invention should, however, not be abandoned. The solution to this problem is based on the idea to provide instantaneously always only a partial frequency adjustment which is proportional to the signal at the output of the phase discriminator 132 always during the corresponding interrogation period. Statistical individual values are, therefore, not recognized while tendencies toward changes are covered as before.

A simple demonstrative example of this further development is formed as can be seen in the partial diagram of FIG. 1a, by introducing a load circuit 54 in the form of a resistor having a resistance value instead of the above mentioned direct contact in the case where the storage member 55 is accomplished by capacitor $C_1$. This resistor 54, is chosen such that $k \cdot R \cdot C_1 = C_a$, whereby $C_a$ is the interrogation period during the die-out of the oscillation of the transducer and k is an elected value for only the partial frequency adjustment during one cycle. Preferred values for k are between $k=0.01$ and $k=0.1$.

The loading of the storage stage 55 initiating at the switching point 56, that is, the change if its present storage state, is accomplished through this resistor in load-circuit 54 is a damped but still proportional mode such that the output signals of the phase discriminator will accept in storage stage 55 individual extreme frequency and phase changes (which might be taking place during the interrogation period $C_a$ of, for example, ten amplitude periods) between alternating voltage of the die-out oscillation process and oscillator alternating current potential are only received in considerably reduced proportion by the factor k. The regulation of oscillator 233 during this period by means of input 56 causes no undesirable sudden steep changes of the oscillator AC-voltage frequency which in turn would lead to an erratic change of the particular phase which would be the input for the phase discriminator 132 in comparing the next following period.

Figure 1B:
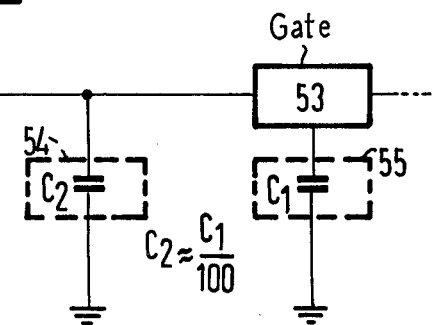

Another further improved version of a solution to this additional objective is given in the partial drawing in FIG. 1b. Here the loading circuit in the form of a capacitor $C_2$ to ground (without conducting leads to the storage stage 55, but always for short periods by means of the additional gate 53), is accomplished parallel to the capacitor $C_1$ of the storage stage 55. Individual extreme output signals of phase discriminator 132 are seen by the capacitor $C_2$, but are again proportionally reduced during transfer to the capacitor $C_1$, which is larger by a factor 1/k, such that in this improved version the load condition of the storage stage 55 again sees no extreme changes. $C_2$ is selected for this purpose at values 100 times smaller than $C_1$.

The two above mentioned further improved versions of the circuit arrangement in accordance with this invention are of specific interest for the special application explained in the following. This special application makes use of the circuit arrangement in accordance with this invention for automatic frequency correction of ultrasonic transducers in the circuit arrangement of the already mentioned German Application No. P 27 21 254.0, filed May 11, 1977.

Figure 2B:
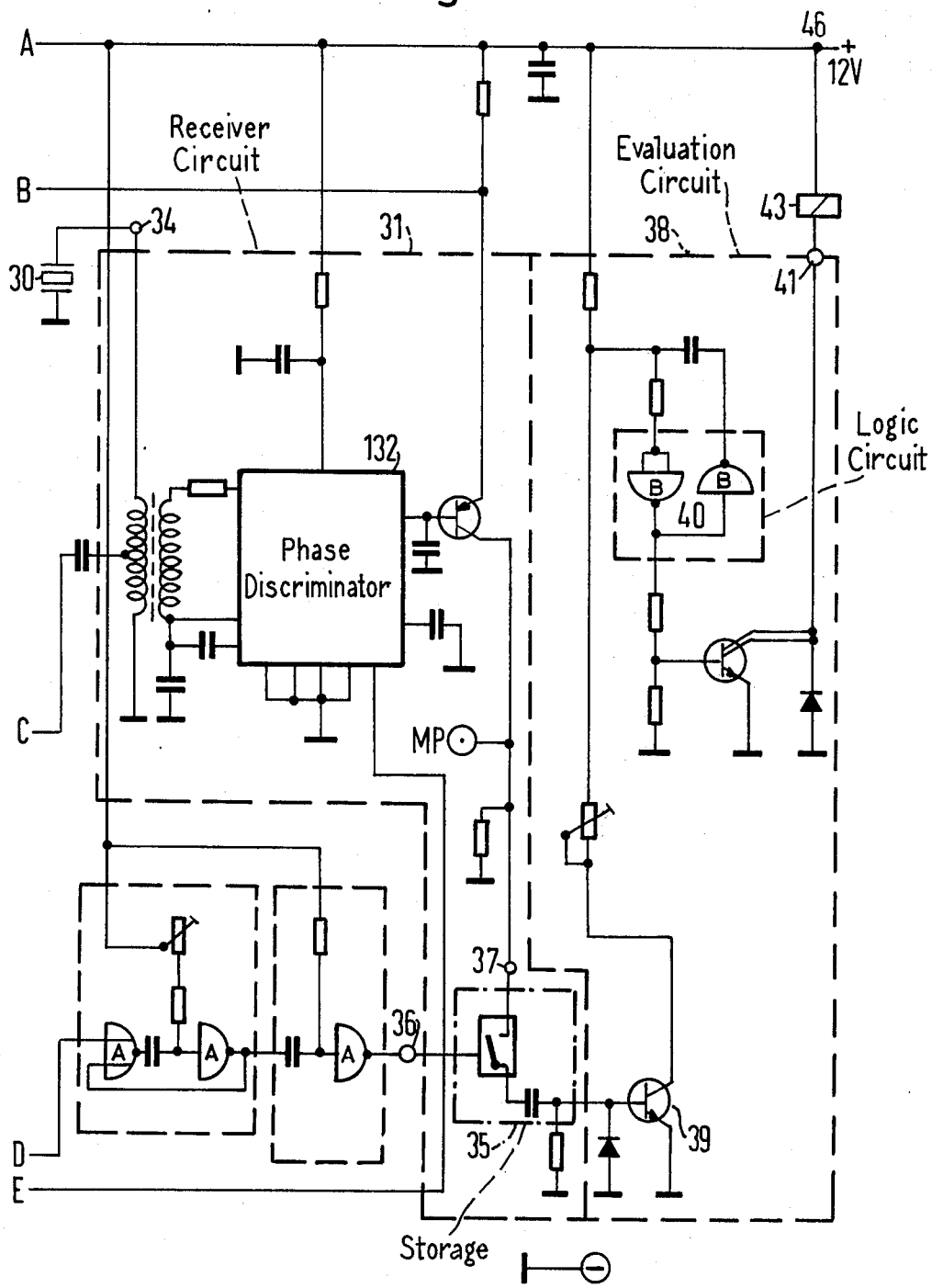
FIG. 2, as shown on two sheets as FIG. 2a and FIG. 2b, is a detailed circuit diagram of a preferred embodiment.

A complete wiring diagram of a preferred circuit arrangement is given in FIG. 2 (broken down on two drawing sheets as FIG.2a and FIG. 2b).

In the circuit arrangement of FIG. 2, the transducer 30 (which in a preferred version can be used also in the form of a transducer of mechanical into electrical energy), is indicated by 30. The transducer receives from the voltage controlled oscillator 233, (indicated by the dotted line in the drawing), by way of the gate circuit 42, and the amplifier 44, its excitation signal which is timing pulse controlled. The gate circuit 42 is controlled by the pulse generator 142. The central phase locked loop is indicated by numeral 145. The generator for the auxiliary pulses is indicated again with numeral 51. An additional gate circuit 53 is shown which is represented by the use of switch symbols. A resistor 54 represents the load circuit 54 of FIG. 1, especially in the first alternative of the mentioned improved developments of this invention. The storage stage is the capacitor which is in FIG. 2 again indicated by numeral 55. The control input point 56 is the control input point for the voltage controlled oscillator 233.

The phase discriminator 132 is again in the circuit diagram of FIG. 2. In the intended function as a phase discriminator in accordance with this invention, a phase discriminator is used in the circuit of FIG. 2 which functions during the actual duty cycle of the circuit. It forms a phase discriminator, and indeed, is used for phase comparison between two successive pulse signals which occur during reception of earlier sent-out ultrasonic waves after reflection from an object. If, for example, this reflection of generated ultrasonic transducer will be different with regard to their respective phase positions, caused by the respective reflected share of the individual successive ultrasonic work cycle pulses.

The receiver 31 contains the phase discriminator 132 and a storage stage 35. This storage stage 35 can be a "sample and hold" circuit which receives at the point 37 from the output of a phase discriminator 132 signals during reception of reflected ultrasonic waves.

The point 36 is also connected to the read-out pulse signal for the storage stage 35. The evaluation circuit 38 (oriented in FIG. 2b to the right of receiver circuit 31), contains a compare circuit 39 which is mainly represented here by a transistor. The logic circuit 40 has a threshold function and is part of the compare circuit 39. At the point 41 in the wiring diagram, the output signal is generated in this particular illustrative circuit arrangement which includes the circuit arrangement in accordance with this invention. The connection to the supply voltage (for example 12 volts), is made at the terminal 46.

The circuit diagram, as shown in FIG. 2, is suitable for the use in the remote control of a water faucet; that is, for the control of its magnetically operated valve 43. This circuit is not only safe with regard to erroneous release occasioned by undesired tampering, but it also, due to the supplements of this invention, insensitive to such breakdowns as caused by aging and individual variations in the transducer of the electronic components of the circuit, and/or due to contamination by wetting or spraying of the transducer. The above mentioned further improvements, for example, in the form of a resistor or additional capacitor of the load circuit 54 assures that the automatic adjustment of the excitation frequency of the transducer 30 in accordance with the features of the invention in hand, will be accomplished very gently and its frequency changes are made so slowly that this frequency control does not interfere with the phase discriminator in the detector mode of the intruder detection application by not impeding the phase comparison of the reflected signals of successive working pulses.

It will be apparent to those skilled in the art that many modifications and variations may be effected without departing from the spirit and scope of the novel concepts of the present invention.

I claim as my invention:

1. Circuit arrangement for inducing resonance oscillations in an ultrasonic transducer which also has the property of generating an alternating current by mechanical excitation of oscillations in the transducer, which circuit comprises an oscillator for generation of an oscillator excitation AC-voltage, a first gate circuit for the pulse wise application of said oscillator AC-voltage to said transducer, said oscillator being frequency controllable, an auxiliary pulse generator being connected to said transducer and parallel to said oscillator and said first gate circuit, a phase discriminator connected to the input connection of said transducer, and to the output connections of said oscillator, an additional gate circuit between the output of said phase discriminator and a control input of said oscillator, a load circuit connected to the control input of said oscillator, a memory storage stage connected to said load circuit and to a second input of said additional gate circuit and a phase locked loop pulse generator which connects the pulse control with said auxiliary pulse generator, said first gate circuit and said additional gate circuit, and the pulse sequence of said phase locked loop pulse generator being such that in one cycle first a pulse is sent to said auxiliary pulse generator after a pause for the impulse generated oscillation and the automatic die-out of the oscillations of said transducer being followed by a pulse being sent to said additional gate circuit by which the phase compared signal of said phase discriminator by way of said additional gate circuit is fed to said control input of said oscillator, the cycle being ended by a pulse being sent to said first gate circuit to initiate transfer of a working pulse to said transducer, whereby, in the case of a no pulse condition of said phase locked loop pulse generator for said additional gate circuit, said storage stage is connected by means of said additional gate circuit with said control input of said oscillator.

2. Circuit arrangement in accordance with claim 1, in which said load circuit is a resistor.

3. Circuit arrangement in accordance with claim 1, in which said load circuit is a first capacitor, and said storage stage is a second capacitor, the value of said second capacitor being small as compared to said first capacitor.

* * * * *